US006657596B2

(12) United States Patent
Djuknic

(10) Patent No.: US 6,657,596 B2
(45) Date of Patent: Dec. 2, 2003

(54) METHOD OF MEASURING A PATTERN OF ELECTROMAGNETIC RADIATION

(75) Inventor: Goran M Djuknic, Tenafly, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 22 days.

(21) Appl. No.: 10/060,485

(22) Filed: Jan. 30, 2002

(65) Prior Publication Data

US 2003/0142023 A1 Jul. 31, 2003

(51) Int. Cl.[7] .............................................. G01R 29/10
(52) U.S. Cl. ......................... 343/703; 343/753; 343/755
(58) Field of Search ................................. 343/703, 753, 343/754, 755; 324/95, 105, 624, 627; 342/127, 131, 133

(56) References Cited

U.S. PATENT DOCUMENTS

| | | | |
|---|---|---|---|
| 3,662,389 A | 5/1972 | Coffin et al. ................. 343/100 |
| 4,201,987 A | 5/1980 | Tricoles et al. .............. 343/703 |
| 4,270,129 A | * 5/1981 | Herper et al. ................ 343/703 |
| 5,410,324 A | * 4/1995 | Bolomey et al. ............. 343/703 |
| 5,576,627 A | * 11/1996 | McEwan ...................... 324/639 |
| 5,656,932 A | 8/1997 | Kitayoshi .................... 324/615 |
| 6,054,848 A | * 4/2000 | Torres .......................... 324/95 |
| 6,144,341 A | * 11/2000 | Kraz ............................ 343/703 |

* cited by examiner

Primary Examiner—Hoang Nguyen
(74) Attorney, Agent, or Firm—Ozer M. N. Teitelbaum

(57) ABSTRACT

A method of measuring a pattern of electromagnetic radiation. A plurality of scattered electromagnetic radiation samples are sensed from a transmitted signal formed from electromagnetic radiation. Thereafter, an antenna pattern from the scattered electromagnetic radiation samples is developed. Each scattered sample includes two-dimensional information corresponding with the power detected at a specific coordinate. The scattered samples may be arranged in a matrix, enabling a three-dimensional beamshape of the antenna pattern to be formulated.

18 Claims, 4 Drawing Sheets

3D PATTERN

METHOD OF MEASURING A PATTERN OF ELECTROMAGNETIC RADIATION

BACKGROUND OF THE INVENTION

I. Field of the Invention

The present invention relates to wireless communications, and more particularly to a method and system for measuring an electromagnetic radiation pattern of an antenna.

II. Description of the Related Art

With the proliferation of wireless communications, the coverage area of antennas has become an increasing area of interest. For example, knowledge of the coverage area of an antenna aides in the field installation of a wireless base station by providing valuable information regarding deadspots as well as high gain regions of the system. The coverage area of an antenna is more commonly referred to as the far-field electromagnetic radiation pattern or Fraunhofer pattern. A Fraunhofer pattern may be defined as the three-dimensional volumetric pattern surrounding an antenna from which electromagnetic radiation appears at a distance to be coming from a single point.

The Fraunhofer pattern of an antenna may be determined by various techniques. To accurately determine an antenna's Fraunhofer pattern, the measurements should be made at a sufficiently large distance away from the antenna to insure the relevant field of the antenna approximates a uniform plane wave. A relatively arbitrary boundary may be established between the aperture field distribution (e.g., the near-field or Fresnel) of the antenna and the far-field using the following mathematical expression:

$$R=2*(D^2/\lambda)$$

where R is the radius of the electromagnetic radiation pattern, D is the aperture or diameter of the antenna, and $\lambda$ is the wavelength of the electromagnetic radiation. For more information, see J. D. Kraus, *Antennas*, $2^{nd}$ ed., McGraw-Hill, 1988, p. 60. It has been established that a tolerable phase difference between the actual, spherical wave front and the ideal plane wave may be, for example, about 22.5°, corresponding with the relatively arbitrary boundary. Referring to FIG. 1, the far-field and the near field patterns, as well as relatively arbitrary boundary are illustrated. From the above, it may be deduced that if the radius, R, is relatively large, direct measurement of the antenna's far-field pattern may be impractical. In such circumstances, the far-field pattern may be indirectly determined by measuring the aperture field distribution (e.g., the near-field) of the antenna. Upon determining the aperture field distribution, the far-field pattern may be mathematically deduced by performing a Fourier transform on the determined distribution.

It should be apparent that direct measurement of an antenna to determine the Fraunhofer pattern involves recording measurements in a number of directions. Given its volumetric properties, the accuracy of a Fraunhofer pattern directly corresponds with the number of measurements recorded over the total solid angle of a sphere—e.g., $4\pi$ steradians. Consequently, an accurate Fraunhofer antenna pattern requires numerous measurements, which is tedious, time consuming, labor intensive, and thusly, expensive.

Alternatively, theoretical analysis may be performed to determine the Fraunhofer pattern of an antenna. Theoretical analysis of a three-dimensional electromagnetic pattern commonly involves applying a model or models of an actual antenna implementation. Here, a model employs a series of numerical solutions based on a number of idealizations and/or assumptions. This approach effectively produces the antenna's Fraunhofer pattern by computational electromagnetics.

In the field of operation—when implementing cellular, PCS, or fixed wireless systems, for example—various additional factors are needed to determine the actual antenna pattern. These factors include the topography of the terrain, atmospheric conditions, as well as man-made structures, for example. Presently, a number of commercially available software packages may be used to the model an antenna's Fraunhofer pattern. While useful, these commercially available software packages may not be sufficiently accurate for certain applications. Though the aforementioned additional factors may be taken into consideration to some degree, these software packages do not rely on actual measurements, but rather model and predict the antenna pattern. For certain applications, the coverage predicted by these software packages may have to be verified—thereby requiring numerous measurements much like experimental examination.

Consequently, a need exists for a method for measuring the pattern of electromagnetic radiation that is more accurate, simpler, faster, less labor intensive, and relatively less expensive than the methods presently known.

SUMMARY OF THE INVENTION

The present invention provides a more accurate, simpler, faster, less labor intensive, and relatively less expensive method for measuring pattern of electromagnetic radiation from an antenna than the methods presently known. The method relies on the principle of scattering to ascertain the far-field measurements needed to determine the pattern of electromagnetic radiation. The antenna first transmits a signal from which a number of scattered electromagnetic radiation samples are sensed. Each scattered sample comprises two-dimensional information corresponding with the power detected at a specific coordinate. Depending on the required accuracy of the antenna pattern, a greater number of samples are accumulated. Once a sufficient number of samples are sensed, a three-dimensional antenna pattern or beamshape may be developed.

The sensing of the present method may be realized using various means. In one embodiment, the sensing is performed by at least one detecting antenna. Here, the one or more detecting antennas scan the scattering region to develop the requisite number of samples. In another embodiment, a number of detecting antennas each sense at least one scattered electromagnetic radiation sample.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

The present invention provides a method and system for measuring the electromagnetic radiation pattern of antenna. The present invention is based on the principles of scattering electromagnetic radiation. More particularly, the properties of a propagation medium, such as air, are characterized by its refractive index. As long as the index is uniform through the medium, the electromagnetic radiation will propagate through without deflection. However, if discrete variations in the refractive index of the medium exist, a portion of the propagating electromagnetic radiation may scatter in all directions, including directions other than the intended direction of propagation. These discrete variations in the air may be attributable to the presence of particles (e.g., dust, water droplets, aerosols, or ice crystals) or to small-scale fluctuations in the medium density, for example.

The aforementioned principles of scattering electromagnetic radiation are applicable over all wavelengths. Nonetheless, these scattering principles depend upon the ratio or scaling factor of the characteristic dimension of the scattered wave to the wavelength. This scaling factor explains why the scattered wave generally occurs at the same wavelength as that of the original electromagnetic radiation. It should be noted that the Doppler effect resulting from wind, for example, might shift the wavelength of the scattered wave a negligible percentage from the wavelength of the original electromagnetic radiation.

According to the present invention, the far-field radiation pattern of an antenna is derived from the attributes of the scattered wave, including, for example, its wavelength, amplitude, phase, and polarization. Given the scaling factor, however, it is contemplated that the present invention may perform more practically for electromagnetic radiation propagating at a wavelength corresponding with 30 GHz to 300 GHz. Various wireless communication systems like local multipoint distribution systems ("LMDS"), as well as a growing number of fixed wireless systems may likely operate in this spectral band (i.e., 30–300 GHz), and will be implemented going forward, given the available bandwidth.

Figure 1:
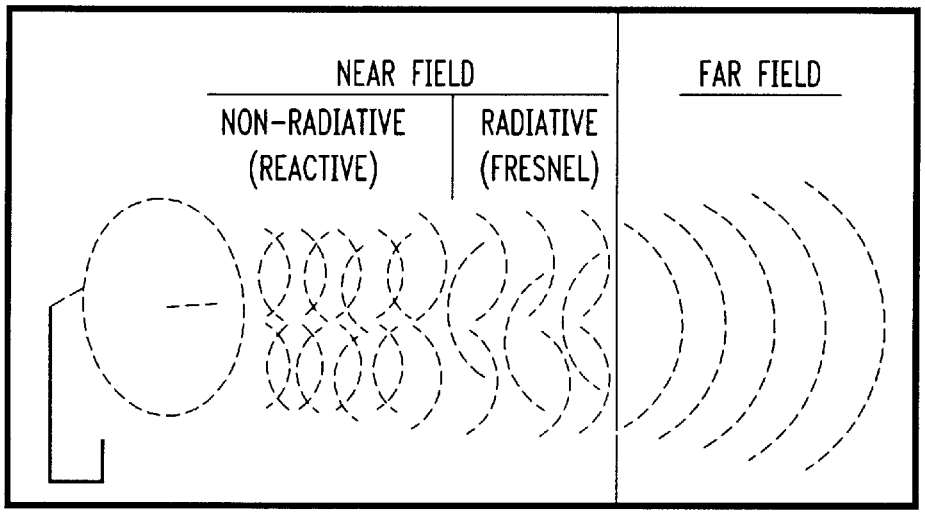
FIG. 1 depicts the far-field and the near field patterns of an antenna.
Figure 2:
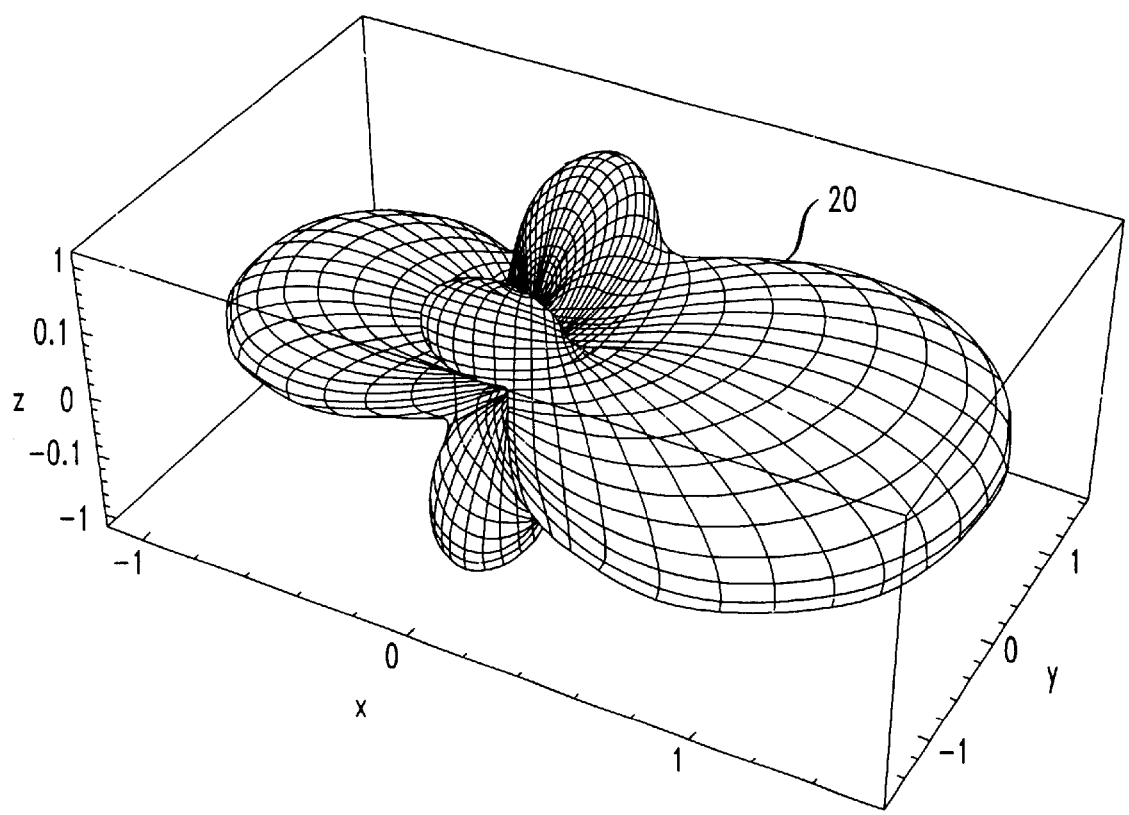
FIG. 2 depicts a three-dimensional electromagnetic radiation pattern of an antenna.

Referring to FIG. 2, a far-field pattern 20 of an antenna (not shown) is illustrated according to the present invention. More particularly, pattern 20 is a three-dimensional electromagnetic radiation pattern. As shown, the three-dimensional electromagnetic radiation pattern corresponds with a V-dipole type antenna.

Figure 3:
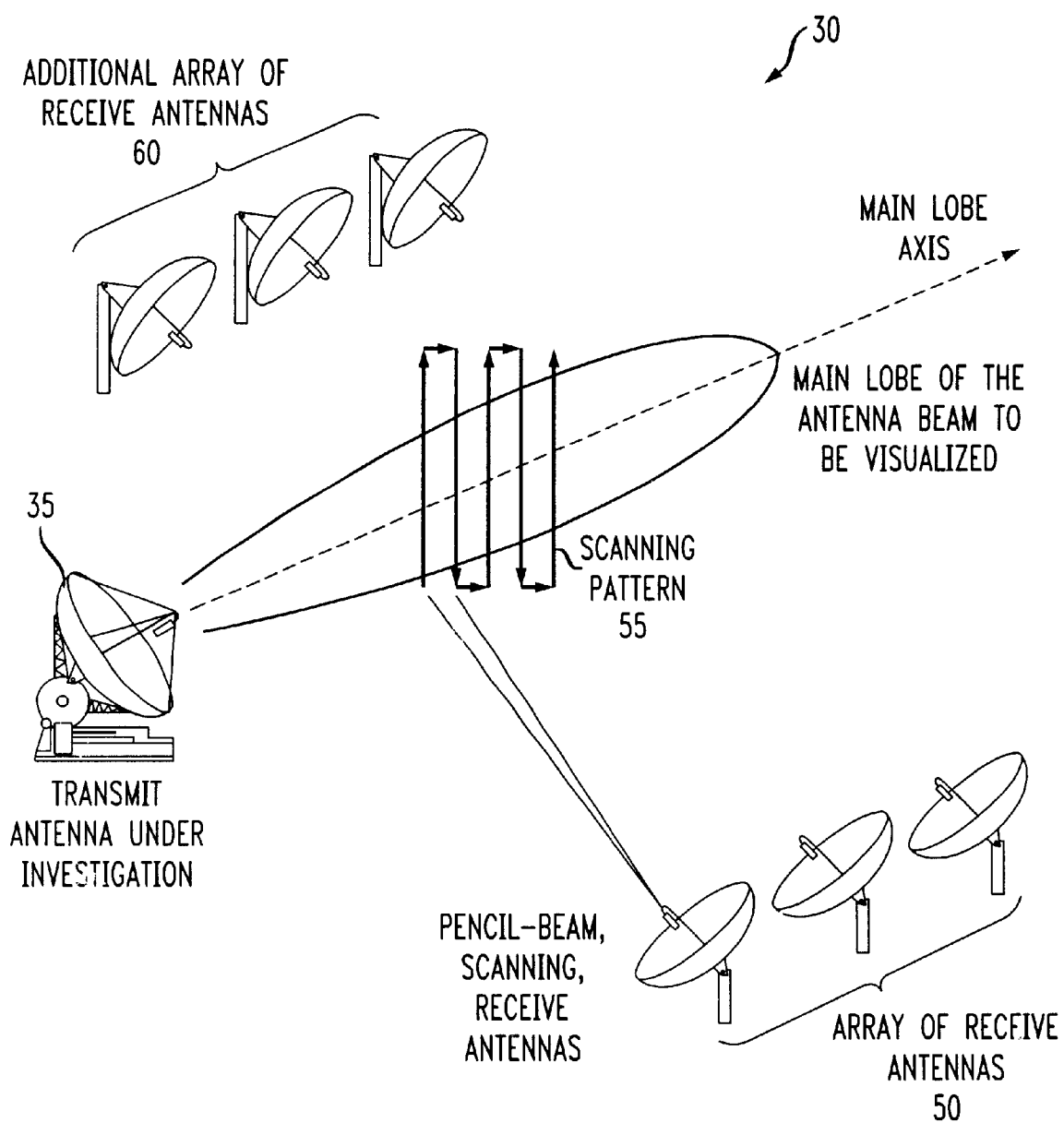
FIG. 3 depicts an embodiment of the present invention.

Referring to FIG. 3, an embodiment of the present invention is illustrated. More particularly, a system 30 is shown for deriving a three-dimensional electromagnetic radiation pattern, such as far-field pattern 20 of FIG. 2. In accordance with the present invention, system 30 may determine the three-dimensional electromagnetic radiation pattern of an antenna 35. Antenna 35 transmits electromagnetic radiation, having at least one main lobe. Using the scattering principles detailed hereinabove, system 30 comprises at least one scattering sensor 50 for sensing scattering within the main lobe. Scattering sensor 50 may be realized by various means, including, for example, at least one pencil-beam, scanning antenna. In such a realization, the scanning antenna of sensor 50 senses a number of two-dimensional scattering samples to develop the three-dimensional electromagnetic radiation pattern of antenna 35. However, the number of two-dimensional samples sensed and/or detected by sensor 50 corresponds with its ability to scan the main lobe for scattered electromagnetic radiation. Sensor 50, here, scans a regional-pattern 55 in at least two-directions to accumulate a sufficient number of samples to develop the desired pattern. To avoid sensing noise or unwanted electromagnetic radiation, sensor 50 may be bandlimited to a range of wavelengths corresponding with the wavelength of the original electromagnetic radiation transmitted by antenna 35, while taking into consideration any potential for the Doppler effect.

Depending on the resolution required for the three-dimensional electromagnetic radiation pattern, it may be advantageous to realize sensor 50 using at least one array of receiving antennas. It should be apparent to skilled artisans that by increasing the number of receiving antennas in the array, the need for each antenna to scan the main lobe in at least two-directions, generally, and more particularly, regional-pattern 55, may be diminished. Likewise, system 30 may further incorporate a second scattering sensor 60 for scanning regional-pattern 55 to accumulate a larger number of samples.

Once the requisite number of two-dimensional scattering samples is sensed, a matrix of scattered samples may be formed. This matrix of two-dimensional scattering samples may then be digitally processed, depending on the application of system 30. Using various software algorithms, the three-dimensional electromagnetic radiation pattern of antenna 35 may be formed directly from the matrix of sensed two-dimensional scattering samples.

In another embodiment of the present invention, system 30 also comprises a feedback mechanism (not shown). The feedback mechanism is incorporated to modify the sensed three-dimensional electromagnetic radiation pattern to a more desirable result, given that the transmitted power of antenna 35 should be knowable or easily determinable. This feedback mechanism may be performed on the fly, in real time, until a desired pattern is formed. The feedback mechanism modifies or varies the transmissive power of the source, or alters the configuration of the antenna to effectuate a change in the antenna's power, and thusly, its three-dimensional electromagnetic radiation pattern.

Figure 4:
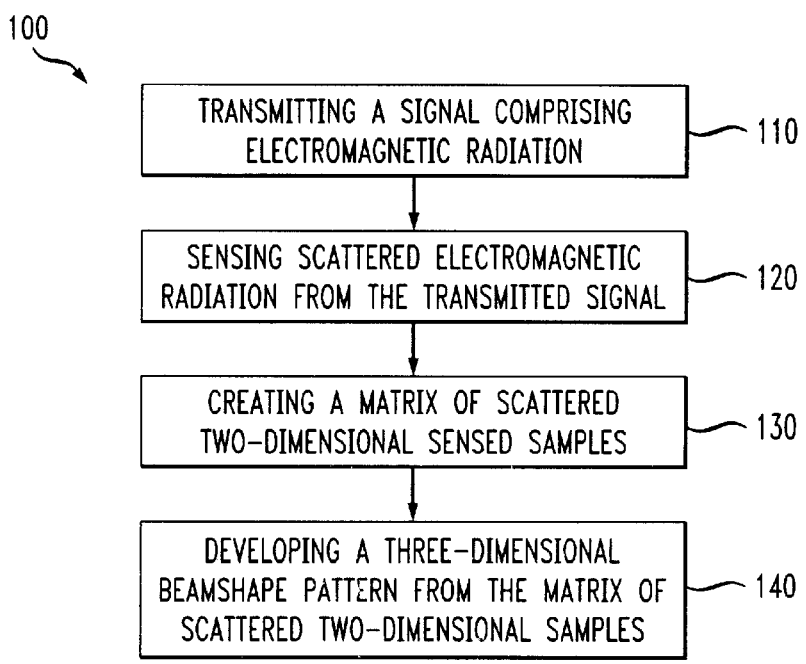
FIG. 4 depicts a flow chart of another embodiment of the present invention.

Referring to FIG. 4, a flow chart 100 of another embodiment of the present invention is illustrated. Flow chart 100 depicts one method in measuring and developing an antenna's three-dimensional electromagnetic radiation pattern. Upon reviewing the instant disclosure, however, it will be apparent to skilled artisans that alternative methods may be derived using the principles of the present invention detailed herein.

Prior to performing the method detailed herein, a signal comprising electromagnetic radiation is initially transmitted (110). As the transmitted signal propagates through the atmosphere, it encounters discrete variations in the air. These discrete variations in the air cause the electromagnetic radiation wave to scatter in all directions.

After the original signal formed form electromagnetic radiation scatters, the method performs a sensing step (120). This sensing step senses the scattered electromagnetic radiation. More particularly, this sensing step may comprise a number of sensing steps to accumulate a sufficient number of scattering samples to develop the three-dimensional electromagnetic radiation pattern with a desired resolution. As noted herein, each scattering sample comprises two-dimensional scattered power information.

Once a sufficient number of scattering samples are sensed, the method may create a matrix from the scattered samples (130). In so doing, various digital processing steps may be executed. It should be noted that advantageous formats in which the scattered samples will become apparent to skilled artisans upon reviewing the instant disclosure.

With the matrix of two-dimensional scattered samples stored, the method develops a beamshape pattern (140). Various software algorithms may be used to develop the desired three-dimensional electromagnetic radiation pattern from the stored information. More particularly, the beamshape pattern may be formed directly from a sufficient number of two-dimensional scattering samples to reach the desired resolution for the particular application.

Figure 5:
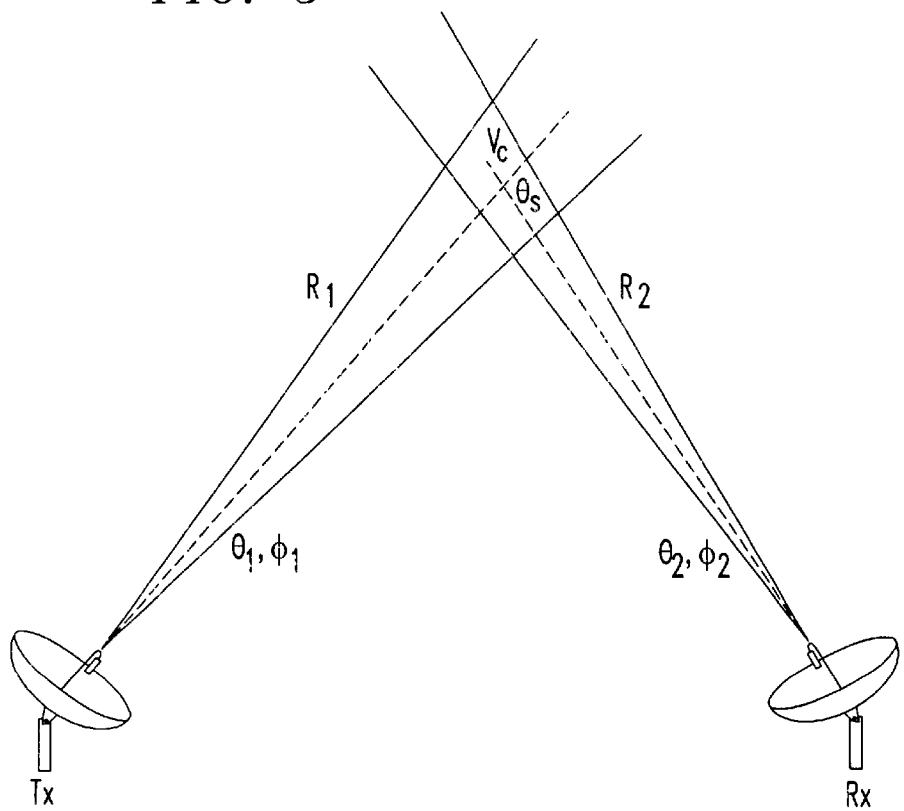
FIG. 5 depicts an example of the present invention.

Referring to FIG. 5, an example of the present invention is illustrated. The numerical values in the present example are intended for demonstrating that the sensing or detecting of the scattered power is presently obtainable. The measurements made by the presently disclosed method may also be used to deduce the properties of the propagating medium and detect the presence of rain or clouds, though the purpose of the present invention is characterize the transmitted signal, and thusly, the transmitting antenna.

In accordance with the example of the present invention herein, at appropriate points in space where electromagnetic radiation is expected, or searched for, scattered energy may be detected by one or more suitable sensors. The results of this detection step are then processed and displayed using any number of techniques. A narrow-beamwidth (e.g., pencil-beam) receive antenna with scanning capability, coupled with a receiver tuned to the wavelength of the electromagnetic radiation to be detected, may serve as a sensor. One- or two-dimensional antenna arrays or phased arrays may be used in place of the scanning antenna. Similarly, each sensor may comprise a wideband antenna and tunable receiver so that the space volume might be explored for any existing electromagnetic radiation. Other types of sensors and implementations will become apparent to skilled artisans upon reviewing the instant disclosure. Processing of the signals detected by the antenna or antennas may, for example, include down-conversion and baseband analysis using methods and algorithms of inverse scattering problems.

Using one receiving antenna to scan the entire beam might not be sufficiently precise due to the parallax. If the receiving antenna is sufficiently far away from the beam under investigation, however, this may not be the case. This may be attributed to the fact that the receiving antenna receives a two-dimensional projection or sample of the three-dimensional beam under investigation onto a plane perpendicular to the main lobe axis of the receiving antenna. An array of receiving antennas, placed along the line parallel to the main lobe axis of the investigated beam, may be used to reduce visualization errors due to the parallax. Furthermore, to enhance the three-dimensional image of the investigated beam, an additional receive antenna array can be placed at a spatially separated location. Signals recorded by all the receiving antennas may be processed simultaneously to reconstruct the three-dimensional antenna radiation pattern from several two-dimensional projections, much like the techniques performed in computerized tomography. It will be apparent to skilled artisans from the instant disclosure that the sensors may be positioned on the ground or at any height above the ground, and that they may be either fixed or mobile. Mobility includes mounting the antenna array on an airplane or a helicopter and overflying the area under investigation, therefore enhancing or substituting the scanning operation of the antennas by the flying movement.

The scattered power received by a pencil-beam antenna may be derived according the depiction in FIG. 5. Vertical half-power beamwidths ("HPBW") for transmit and receive antennas are depicted as $\theta_1$ and $\theta_2$, respectively, while the horizontal HPBWs for transmit and receive antennas are depicted as $\phi_1$ and $\phi_2$, respectively. The distance from a common volume, $V_c$, to a transmitting antenna, $T_x$, is $R_1$, while the distance from a receive antenna, $R_x$, to the common volume, $V_c$, is $R_2$. Moreover, the angle between main lobe axes of transmit and receive antennas, $T_x$ and $R_x$, is $\theta_s$. The ratio of the received scattered power, $P_r$, and the transmit power, $P_t$, may then be mathematically expressed by the following equation:

$$\frac{P_r}{P_t} = 6.08 \times 10^{-4} \frac{\lambda^2 G_t G_r \theta_1 \theta_2 \phi_1 \phi_2}{\sqrt{R_1^2 \phi_1^2 + R_2^2 \phi_2^2}} \rho \langle \sigma_b \rangle \frac{1}{\sin\theta_s} e^{-\gamma_1 - \gamma_2}$$

where $\lambda$ is the electromagnetic radiation wavelength, $\rho$ is the density of the particles in the medium (e.g., air), $<\sigma_b>$ is the average bi-static scattering cross section of particles, $\gamma_1$ is the optical distance from the transmit antenna to the common volume, $V_c$, defined by $\gamma_1 = R_1 \rho <\sigma_t>$, $\gamma_2$ is the optical distance from $V_c$ to the receive antenna defined by $\gamma_2 = R_2 \rho <\sigma_t>$, and $<\sigma_t>$ is the average particle cross-section. For more information, see A. Ishimari, *Wave propagation and Scattering in Random Media,* IEEE Press and Oxford University Press, 1997, pp. 74–77.

From the above expression, the gains of the antenna may be characterized by the following equations:

$$G_t = \eta_t \frac{4\pi A_t}{\lambda^2} \text{ and } G_r = \eta_r \frac{4\pi A_r}{\lambda^2}$$

where $G_t$ is the transmit gain, $G_r$ is the receive gain, $\eta_t$ and $\eta_r$ are aperture efficiencies, and $A_t$ and $A_r$ are aperture areas, respectively, and $\lambda$ is the electromagnetic radiation wavelength.

In one example, if a 30-GHz carrier is transmitted by a one-foot parabolic-dish antenna and sensed by a three-foot parabolic-dish antenna, the aperture areas may be expressed as follows:

$$A_t = \frac{\pi D_t^2}{4} \text{ and } A_r = \frac{\pi D_r^2}{4}$$

where $D_t$ and $D_r$ are transmit and receive dish diameters, respectively. Consequently, the transmit and receive HPBWs may be stated as by the following mathematical equations:

$$\theta_1 = \phi_1 = \alpha \frac{\lambda}{D_t} \text{ and } \theta_2 = \phi_2 = \alpha \frac{\lambda}{D_r}$$

where the constant $\alpha$ can take values from 1.3 to 1.6, depending on the field distribution over the aperture. If we select $\alpha = 1.5$, the far-field transmitting antenna pattern begins at a radius of about 18 meters, and the common volume, $V_c$, begins at a distance of about 500 meters from both the transmitter and the receiver. Consequently, the angle, $\theta_s$, between main lobe axes of transmit and receive antennas, $T_x$ and $R_x$, is about $\theta_s = \pi/2$. To enhance the scattering effect, an assumption that measurements are performed in light rain yields an average particle cross-section of about $\rho <\sigma_t> = 0.075$ dB/km and an average bi-static scat tering cross section of particles of about $\rho<\sigma_b>==0.035$ dB/km. From these calculations, the resulting power ratio, $$\frac{P_r}{P_t},$$

is about $1.13\times10^{-11}$. Therefore, the received scattered power may be estimated at about −109.45 dB down is from the transmitted power level—an obtainable result using the present day, state-of-the-art receivers.

Figure 6:
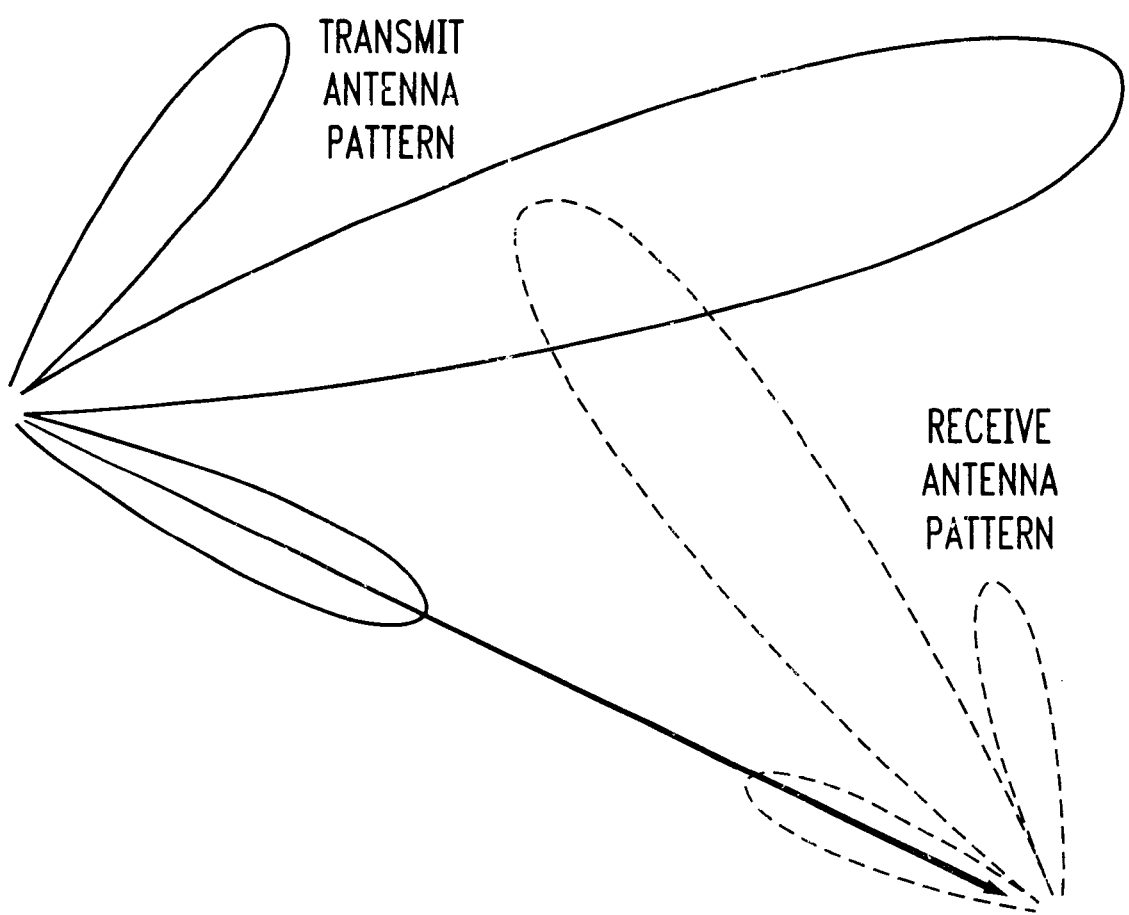
FIG. 6 depicts another example of the present invention.

Referring to FIG. 6, another example of the present invention is illustrated. As shown, in addition to the scattered electromagnetic radiation, electromagnetic radiation directly propagating from the side lobes of the transmitting antenna may also be detected by the receiving sensor (e.g., pencil beam antenna). Consequently, the main and/or the side lobes of the receiving sensor may detect this side lobe electromagnetic radiation directly transmitted from the transmitting antenna. By this arrangement, an interference path may be created through the side lobes of the transmit antenna and the receiving sensor(s).

It should be noted, however, that the originating electromagnetic radiation signal and the scattered energy may be distinguished and thusly, separated, in several ways. One approach relies on the polarization separation between the originating signal and the scattered energy. Generally, scattered energy is elliptically polarized irrespective of the polarization of the originating electromagnetic radiation signal. Consequently, the present method may be employed with a linearly polarized transmit antenna(s). Another approach for distinguishing the originating electromagnetic radiation signal and the scattered energy relies on the dynamic introduction of nulls in the receiving antenna pattern, introduced in the direction of side lobes of the transmit antenna.

The present invention provides a method and system for measuring the far-field pattern of antennas, and, thusly, the wireless coverage in the field of operation with the conditions directly in hand. Consequently, the present invention may be used to measure and visualize radiation patterns of implemented antennas, and for picturing wireless coverage in field conditions, with the results presented in a user-friendly manner of still and animated graphics. Likewise, the present invention may serve as a tool in antenna design, verifying the anticipated wireless coverage, as well as provide a technique for "fine tuning" of the wireless system on the fly, after implementation. The present invention may also be applied in dynamic situations, namely where the wireless coverage is variable by design (e.g., smart antennas) and, thusly, where classically known methods of measurement are overly cumbersome. Similarly, the present invention may also be applicable in a rough, possibly automated evaluation of the coverage provided by plug-and-play base stations, where detailed measurements would be too costly. It should be noted that the invention may be implemented on the ground, high towers, or in the air (e.g., from planes, helicopters, and/or blimps).

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system and portions thereof and of the described method and system may be implemented in different locations, such as the wireless unit, the base station, a base station controller, a mobile switching center and/or a radar system. Moreover, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

What is claimed is:

1. A method of measuring a pattern of electromagnetic radiation comprising:

sensing at least two scattered electromagnetic radiation samples from a transmitted signal comprising electromagnetic radiation;

bandlimiting the sensing of the at least two scattered electromagnetic radiation samples to a range of wavelengths corresponding with the transmitted electromagnetic radiation; and developing a pattern of electromagnetic radiation from the at least two scattered electromagnetic radiation samples.

2. The method of claim 1, further comprising:

feeding back the at least two scattered electromagnetic radiation samples to a source for the transmitted electromagnetic radiation.

3. The method of claim 2, further comprising:

compensating for the developed electromagnetic radiation pattern by varying the transmitted power of the source.

4. The method of claim 3, wherein the step of compensating for the developed electromagnetic radiation pattern comprises:

employing an initial transmissive power as a reference point in the varying of the transmitted power of the source.

5. The method of claim 4, wherein the source comprises an antenna.

6. The method of claim 1, wherein each of the scattered electromagnetic radiation samples comprises at least two-dimensional data.

7. The method of claim 6, wherein the step of developing an electromagnetic radiation pattern comprises:

forming a matrix of two-dimensional scattered electromagnetic radiation samples; and formulating a three-dimensional beamshape from the matrix of two-dimensional scattered electromagnetic radiation samples.

8. A method of measuring the characteristics of an antenna comprising:

sensing scattered electromagnetic radiation from a signal comprising electromagnetic radiation transmitted by a source using the antenna;

creating a matrix of scattered two-dimensional electromagnetic radiation sensing samples from the sensed scattered electromagnetic radiation; and developing a pattern of electromagnetic radiation of the antenna from the matrix of scattered samples.

9. The method of claim 8, wherein the sensed scattered electromagnetic radiation is bandlimited to a range of wavelengths corresponding with the wavelength of the electromagnetic radiation transmitted by the antenna.

10. The method of claim 9, further comprising:

feeding back the matrix of scattered samples to the source; and compensating for the developed electromagnetic radiation pattern by varying the transmissive power of the source.

11. The method of claim 10, wherein the step of compensating for the developed electromagnetic radiation pattern comprises:

employing the transmissive power as a reference point in the varying of the transmissive power of the source.

12. The method of claim 9, wherein the step of developing an electromagnetic radiation pattern comprises:

formulating a three-dimensional beamshape of the antenna from the matrix of scattered samples.

13. A system for measuring a pattern of electromagnetic radiation comprising:

at least one sensor for detecting a plurality of two-dimensional scattered electromagnetic radiation samples from a transmitted signal comprising electromagnetic radiation; and a processor for developing the pattern of electromagnetic radiation from the plurality of two-dimensional scattered electromagnetic radiation samples, wherein the pattern of electromagnetic radiation developed by the processor comprises a three-dimensional beamshape.

14. The system of claim 13, wherein the sensor comprises at least one antenna capable of scanning in at least two directions.

15. The system of claim 13, further comprising a feedback system for feeding back the scattered samples to a source of the transmitted signal.

16. The system of claim 15, further comprising a compensating system for varying the transmissive power of the source in response to the developed pattern of electromagnetic radiation.

17. The system of claim 16, wherein the compensating system employs an initial transmissive power of the source as a reference point.

18. A system for measuring a pattern of electromagnetic radiation comprising:

at least one sensor for detecting a plurality of two-dimensional scattered electromagnetic radiation samples from a transmitted signal comprising electromagnetic radiation wherein the at least one sensor is bandlimited to a range of wavelengths corresponding with the transmitted signal; and a processor for developing the pattern of electromagnetic radiation from the plurality of two-dimensional scattered electromagnetic radiation samples.

* * * * *